United States Patent [19]

Agnello

[11] Patent Number: 5,228,093
[45] Date of Patent: Jul. 13, 1993

[54] METHOD FOR MIXING SOURCE AUDIO SIGNALS AND AN AUDIO SIGNAL MIXING SYSTEM

[76] Inventor: Anthony M. Agnello, 407 Prospect Ave., Princeton, N.J. 08540

[21] Appl. No.: 781,984

[22] Filed: Oct. 24, 1991

[51] Int. Cl.$^5$ .............................................. H04B 1/00
[52] U.S. Cl. ...................... 381/119; 381/98; 381/103
[58] Field of Search .................. 381/98, 103, 1, 119, 381/28

[56] References Cited

U.S. PATENT DOCUMENTS

| | | |
|---|---|---|
| 4,628,530 | 12/1986 | Op De Beek et al. ............. 381/103 |
| 4,748,669 | 5/1988 | Klayman ................... 381/1 |
| 4,751,739 | 6/1988 | Serikawa et al. .................. 381/103 |

*Primary Examiner*—Forester W. Isen
*Attorney, Agent, or Firm*—Kenyon & Kenyon

[57] ABSTRACT

A method for mixing source audio signals and an audio signal mixing system including a spectral content analyzer to determine the spectral content of input audio signals and to arrange the spectral content of the respective input audio signals into a plurality of spectral bands. Based on the determined energy levels in each of the spectral bands of the respective input audio signals, the audio signal mixing system modifies the energy levels corresponding to one of the input audio signals in a predetermined manner. In essence, the system looks at the spectral data content corresponding to each input audio signal (for example first and second audio input signals) and carves energy out of the energy levels of one of those spectral data signals in the spectral bands where the other spectral data signal has energy levels. The combination of the carved-out spectral data signal with the untouched spectral data signal yields a cleaner overall signal as a result of reduction of competition for dominance of energy levels in predetermined spectral bands, and accordingly, less psychoacoustic masking.

18 Claims, 3 Drawing Sheets

METHOD FOR MIXING SOURCE AUDIO SIGNALS AND AN AUDIO SIGNAL MIXING SYSTEM

FIELD OF THE INVENTION

The invention relates to a method for mixing source audio signals. More particularly, this invention relates to an audio signal mixing system for analyzing audio source signals and modifying one or more of those source signals prior to mixing them.

BACKGROUND INFORMATION

Present day mixing techniques in audio systems involve the summation of two or more source audio signals to produce a combined audio signal output. It is known that audio systems have a finite dynamic range. As a result audio system operators need to be cognizant of this dynamic range limitation so as not to mix two or more audio signals which result in an output signal having an output level (amplitude) which exceeds the finite dynamic range of the audio system. When the summation of, for example, two audio source signals results in an output signal having a signal level which exceeds the finite dynamic range of the audio system, the output signal may be limited, or clipped, by the system. The result of such limiting or clipping may be unwanted distortion in the output signal.

In order to avoid output signal limitations due to the constraints imposed by the dynamic range of the audio system, many system operators simply reduce the amplitude of one or both of the audio source signals. For example, if two audio source signals are to be combined, the operator may choose to reduce the source signal amplitude of both of the audio source signals to half of their original source signal values, prior to adding the signals. Alternatively, the operator may reduce the amplitude of one source signal proportionally more than the other source signal, depending upon desired results, to produce an output signal which is still within the dynamic range of the audio system.

For example, if an audio system operator wanted to mix two signals such as a voice signal and a background music signal, the operator would have to adjust the respective signal levels to arrive at a desired result. If the voice signal is expected to be dominant, the operator would apply a proportionately greater reduction to the background music signal, relative to the reduction in the voice signal level, to achieve that result.

In short, source audio signals could not be mixed without signal reduction, if those individual source signals are at, or near, the maximum source signal amplitude allowed by the audio mixing system finite dynamic range.

Audio system operators have the capability to affect more than just signal amplitude of an audio signal. In particular, operators may modify a given audio signal by filtering specific frequency components therein. These methods however modify signals based on specific frequencies and do not allow for signal modification based on the energy levels of frequency components of another reference signal.

Whenever voice signals are combined with other audio signals, such as music signals, there is the opportunity for psychoacoustic masking to occur. This phenomenon of psychoacoustic masking can best be described as the domination of a higher energy signal at a given frequency over lower energy signals at frequency ranges immediately surrounding the given frequency of the high energy signal. The result of psychoacoustic masking is the transmission of non-discernible portions of complex signals. Masking is especially prevalent in the combination of voice signals with music signals leading to unintelligibility of the voice component of the combined signal.

The frequency spectrum of a voice signal may be divided into groupings of harmonically related frequencies, call formants. A voice signal may contain up to four formants, with higher frequency formants containing much less energy than lower frequency formants. As a result, the lower energy formants tend to fall victim to masking by higher energy music signals of like frequencies.

Accordingly, it is an object of this invention to provide a method for mixing two or more source audio signals of substantially equal amplitudes to produce a combined audio signal of substantially the same amplitude as each of the source audio signals.

It is another object of the invention to break down at least one of the two or more source audio signals, which are time domain signals, into a frequency based signal having spectral bands.

It is another object of the invention to modify a second source audio signal by reducing the audio signals's energy levels in specific spectral bands.

It is still another object of the invention to reduce psychoacoustic masking of audio signals as a result of mixing by, reducing the energy levels of a source audio signal to be mixed at selected points, by an amount corresponding to the energy levels of another source audio signal.

It is yet another object of the invention to improve the energy level and quality of mixed audio signals in an audio signal mixing system.

SUMMARY OF THE INVENTION

Briefly, the invention provides a method for mixing source audio signals and an audio signal mixing system for mixing audio signals without the need for an across-the-board amplitude reduction in the respective source signals.

The audio signal mixing system comprises a spectral content analyzer, a modifier device including means for modifying a spectral data signal and, means for adding to produce a combined signal and a synthesis device for synthesizing the combined signal.

The spectral content analyzer provides for the analysis of the respective source audio signals, for example, first and second source audio signals to determine their spectral content. The spectral content of each of the source audio signals is simply an aggregation of that audio signal's component frequencies, each component frequency having its own amplitude and phase. The spectral content of the respective source signals is arranged in a plurality of spectral bands.

The spectral content analyzer may further comprise circuitry for determining the energy levels for each of the spectral bands of the first source audio signal. The output from the spectral content analyzer comprises a first and a second spectral data signal, with the first spectral data signal corresponding to the first source audio signal and the second spectral data signal corresponding to the second source audio signal. This first spectral data signal is then sent to the modifier device.

The second source audio signal is also spectrally analyzed in the spectral content analyzer and a second spectral data signal is generated in substantially the same manner as the first spectral data signal. The second source audio signal is then modified via the means therefor in the modifier device to reduce the energy levels of the second source audio signal in selected spectral bands by an amount which is proportional, and typically equal, to the respective energy levels of the first source audio signal in corresponding selected spectral bands. This procedure essentially looks at the signal makeups of each of the first and second spectral data signals and "carves" energy out of the energy levels of the second spectral data signal in the spectral bands where the first spectral data signal has its energy levels. When the signals are combined, this produces a combined signal which includes a first source audio component that is heard more clearly because of the cleaner combination of signals. Also, when the respective energy levels of the first and second source audio signals, in particular spectral bands, do not compete for dominance, the combined signal exhibits less psychoacoustic masking and reduces the potential for distortion.

The audio signal mixing system eliminates the problems associated with amplitude adjustment of source signals for the purpose of avoiding the upper limits of an audio system's finite dynamic range. In fact, this provides for the mixing of source signals of full amplitude, even if the combination of the source signal amplitudes would, if added, exceed the system's dynamic range. This is possible because the mixing system does not "add" signals. Rather the mixing system "carves" out of the second source audio signal energy levels a signal pattern equivalent to the energy levels of the first source audio signal, to allow for precise mixing of the respective source signals. In essence, the first source audio signal is placed into the second source audio signal when mixed.

The mixing system allows for a combination of any number of source signals in substantially the same manner as described above. As such, the mixing of signals can now be controlled to provide for improved results and a cleaner sound due to reduced distortion from signal limitation and signal masking.

These and other objects and advantages of the invention will become more apparent from the following detailed description taken in conjunction with the accompanying drawings wherein:

PREFERRED EMBODIMENT FOR CARRYING OUT THE INVENTION

Figure 1:
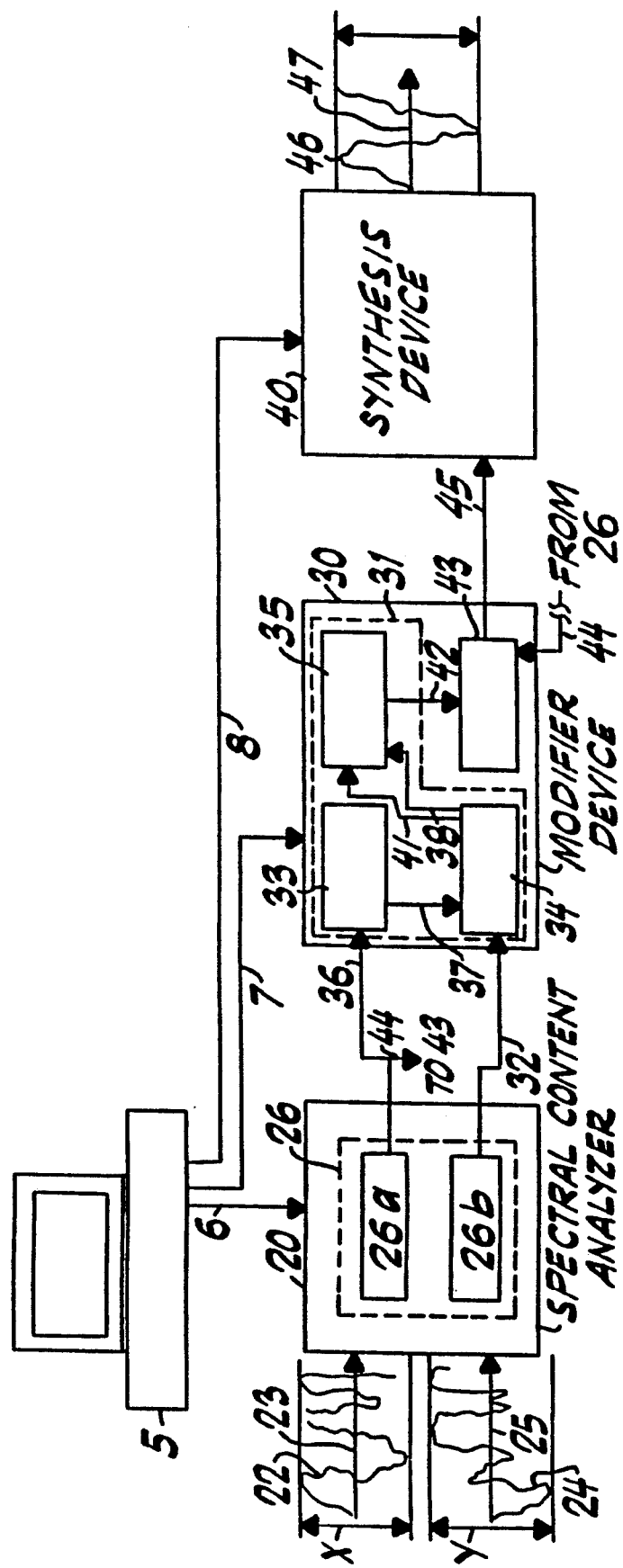
FIG. 1 illustrates a schematic of an audio signal mixing system in accordance with the invention.

Referring to FIG. 1, the audio signal mixing system 10 includes a processor 5, a spectral content analyzer 20, a modifier device 30, and a synthesis device 40.

The spectral content analyzer 20 receives a first source audio signal 22 having an amplitude X on input signal line 23 and a second source audio signal 24, having an amplitude Y on an input signal line 25.

The spectral content analyzer 20 of the audio signal mixing system 10 also includes means, for example, analyzer circuitry 26, for determining first and second source audio signals 22, 24 energy levels. The analyzer circuitry 26 is appropriately programmed to receive software instructions from the processor 5 at a predetermined time prior to accepting any audio source signal input. Such an arrangement allows the analyzer circuitry 26 to execute the software independent of the processor 5. The analyzer circuitry 26 then receives the first source audio signal 22 and is further programmed to break down the first source audio signal 22 into its frequency components. For the purpose of defining these frequency components with respect to time, the analyzer circuitry 26 places the frequency components of the first source audio signal 22 into contiguous predetermined spectral bands.

The analyzer circuitry 26 implements its break down of the first source audio signal 22, by applying a Fourier Transform analysis to this signal 22. The application of Fourier Transform analysis to time-based energy signals is well known. The result, is a representation of such time based signals as an aggregate of elementary sinusoids, each sinusoidal signal have a discrete predetermined fundamental frequency and phase.

The function of the analyzer circuitry 26 then, is to transform the first source audio signal 22 into a finite number of sinusoids of specific preselected phases and amplitudes. The analyzer circuitry 26 therefore, converts a time domain signal (first source audio signal 22) into a first spectral data signal (not shown).

The analyzer circuitry 26 also receives the second source audio signal 24 and processes it in substantially the same manner as it does the first source audio signal 22. The inputted second source audio signal 24 is broken down by application of the same Fourier Transform analysis to yield a frequency-based signal comprising an aggregate of elementary sinusoids each having a discrete selected fundamental frequency and phase. The analyzer circuitry 26 converts the time-based second source audio signal to a second spectral data signal (not shown).

As shown, the analyzer circuitry 26 comprises first and second analyzer circuit boards 26a and b to receive and analyze the first and second source audio signals 22, 24, respectively. Each of the first and second analyzer circuit boards 26a and 26b operate in the identical manner to that described above with respect to the analyzer circuitry 26.

The audio signal mixing system 10 also includes: a modifier device 30 which includes means 31 for modifying the second spectral data signal 24 received via a signal line 32. The means for modifying 31 further includes first and second calculating means 33 and 34, respectively and scaling means 35. The first calculating means 33 receives the first spectral data signal from signal line 36 and calculates energy levels for the first spectral data signal within predetermined spectral bands. The first calculating means 33 may, for example, comprise logic circuitry programmed to receive the first spectral data signal and to determine signal amplitude at preselected frequencies within the respective predetermined spectral bands. The first calculating means 33 outputs a first calculated signal onto signal line 37, such first calculated signal comprising, for example, digital data representative of the calculated energy levels within the respective predetermined spectral bands.

The second calculating means 34 receives the first calculated signal and, in turn, calculates an inverse filter of the first calculated signal. The second calculating means 34 may, for example, comprise logic circuitry programmed to receive the first calculated signal and the second spectral data signal and to calculate energy signal levels for each of the preselected frequencies in the respective predetermined spectral bands of the second spectral data signal. The energy signal levels of the first calculated signal are then modified by the second calculating means 34 to be inversely proportional to the energy signal levels of the second spectral data signal. The second calculating means 34 is adapted to accept the second spectral data signal on signal line 32 and is appropriately programmed to refer to each of respective spectral bands of the second spectral data signal in order to determine the level of inverse proportionality in the resultant inverse filter. The inverse filter may comprise, for example, digital data and is output on signal line 38 to the means for scaling 35.

The scaling means 35, in the means for modifying 31, receives from the second calculating means 34, both the inverse filter, on signal line 38 and the second spectral data signal, on signal line 41. The scaling means applies the inverse filter to the second spectral data signal to produce a scaled second spectral data signal on signal line 42.

The application of the inverse filter to the second spectral data signal in the scaling means 35, may be implemented by logic circuitry programmed to perform what are essentially multiplication operations on energy level components within the respective predetermined spectral bands of the second spectral data signal. Since the energy level for a preselected frequency within any predetermined spectral band may comprise digital data, the multiplicative operations involved with the application of the inverse filter to the second spectral data signal are relatively straightforward. When the inverse filter is applied to the second spectral data signal, each signal amplitude for each preselected frequency in each predetermined spectral band is multiplied by the corresponding amplitude of the inverse filter for the corresponding preselected frequency in the corresponding predetermined spectral band. Since the inverse filter represents the inverse proportion of the first calculated signal in terms of energy level for preselected frequencies, the application of the inverse filter to the second spectral data signal will reduce the signal strength i.e., energy level of the second spectral data signal for those frequencies at which the first calculated signal has an energy level as calculated in the first calculating means.

For example, where two signals to be mixed comprise a narration signal as the first source audio signal 22 and a music signal as the second source audio signal 24, the music signal will be scaled in the scaling means 35, after it has been spectrally analyzed in the analyzer circuitry 26. Assume, for the sake of example, a hypothetical case of a single spectral band for each of the spectrally analyzed source signals, and assume a single preselected frequency of 100 Hz. If the first calculated signal contains an energy level which is at full scale, at the preselected frequency of 100 Hz, the inverse filter would multiply the amplitude (energy level) of the spectrally analyzed music signal (second spectral data signal) by zero, to remove any "music" component for 100 Hz in the spectral band. Similarly, if the first calculated signal contains an energy level which is at one-half scale at 100 Hz, the inverse filter would multiply the amplitude of the spectrally analyzed music signal by 0.5 to reduce the music component for 100 Hz in the spectral band to 50% of its original value. As a final example, if the first calculated signal contains no energy level (zero scale) at 100 Hz, the inverse filter would multiply the amplitude of the spectrally analyzed music signal by 1.0, such that the "zero scale" music component remains unchanged.

In an alternative embodiment, the scaling means 35 may comprise logic circuitry programmed to receive both the inverse filter of the first spectral data signal, and the second spectral data signal, and perform the multiplication operations described above, however such multiplication operations are conducted over a range of frequencies immediately surrounding each preselected frequency. Specifically, using the example above, for the single preselected frequency of 100 Hz, the scaling means 35 provides for the multiplication of the second spectral data signal amplitude by the inverse filter amplitude at the single preselected frequency, as described above. Also the scaling means 35 multiples the second spectral data signal amplitudes for a range of contiguous preselected frequencies, for example, 90-110 Hz by a corresponding range of factors. This provision effectively modifies, or reduces, the signal amplitudes of the second spectral data signal for single preselected frequencies, as well as the signal amplitudes of the second spectral data signal for a contiguous range of frequencies around each of the single preselected frequencies.

The scaling means 35 may be further programmed to modify the signal amplitudes of the second spectral data signal, over the range of contiguous preselected frequencies in a predetermined proportion to the modification performed on the single preselected frequency. For example, in a particular range of contiguous preselected frequencies, the signal amplitudes (energy levels) for the second spectral data signal at 95 Hz may be modified in a predetermined proportion to the inverse filter amplitude for the single preselected frequency within that range (100 Hz). Wherein the second spectral data signal may have been reduced, at 100 Hz to, for example, 75% of its original value, the same signal, at 95 Hz, (within a predetermined spectral band) may only be reduced to 90% of its original value. Similarly, at 90 or 110 Hz (the extremes of the example range above) the second spectral data signal may only be reduced to 99% of its respective original values (within a predetermined spectral band).

The modification in signal amplitudes for the range of contiguous preselected frequencies may be made in accordance with a predetermined linear relationship. Of course the modifications made to each signal amplitude for frequencies in the range of contiguous preselected frequencies may also be in accordance with some non-linear relationship, for example, such may follow an exponential relationship.

The effect of modifying signal amplitudes of the second spectral data signal over a range of contiguous preselected frequencies is a reduction in the psycho-acoustic masking phenomenon, and a resultant increase in audio signal intelligibility.

The modifier device 30 also includes means 43 for adding the first spectral data signal and the scaled second spectral data signal. The means 43 for adding the first and scaled second spectral data signals receives, as input, the first spectral data signal on signal line 44 from the analyzer circuitry 26. Also, the scaled second spectral data signal is received by the means 43 for adding on signal line 42 from the means 35 for scaling. The means 43 for adding then adds to the first spectral data signal (at amplitude X) and the second scaled spectral data signal (at amplitude Y) to produce a combined signal (at amplitude Z) which it outputs to a synthesis device 40 on signal line 33.

The system further includes a synthesis device 40 which is adapted to receive the combined signal from the modifier device 30 on signal line 45. The combined signal, at the point of input to the synthesis device 40, is still in a spectral band format. The synthesis device 40, transforms the spectral band formatted signal (combined signal) to a time domain signal. The synthesis device 40, may for example, employ circuitry programmed to apply inverse Fourier Transform techniques to the combined signal to produce a synthesized combined signal 46 which it outputs on signal line 47. The synthesized combined signal 46 is also of a substantially equal amplitude to the amplitudes of each of the first and second source audio signals 22, 24, respectively (X=Y=Z).

Figure 2A:
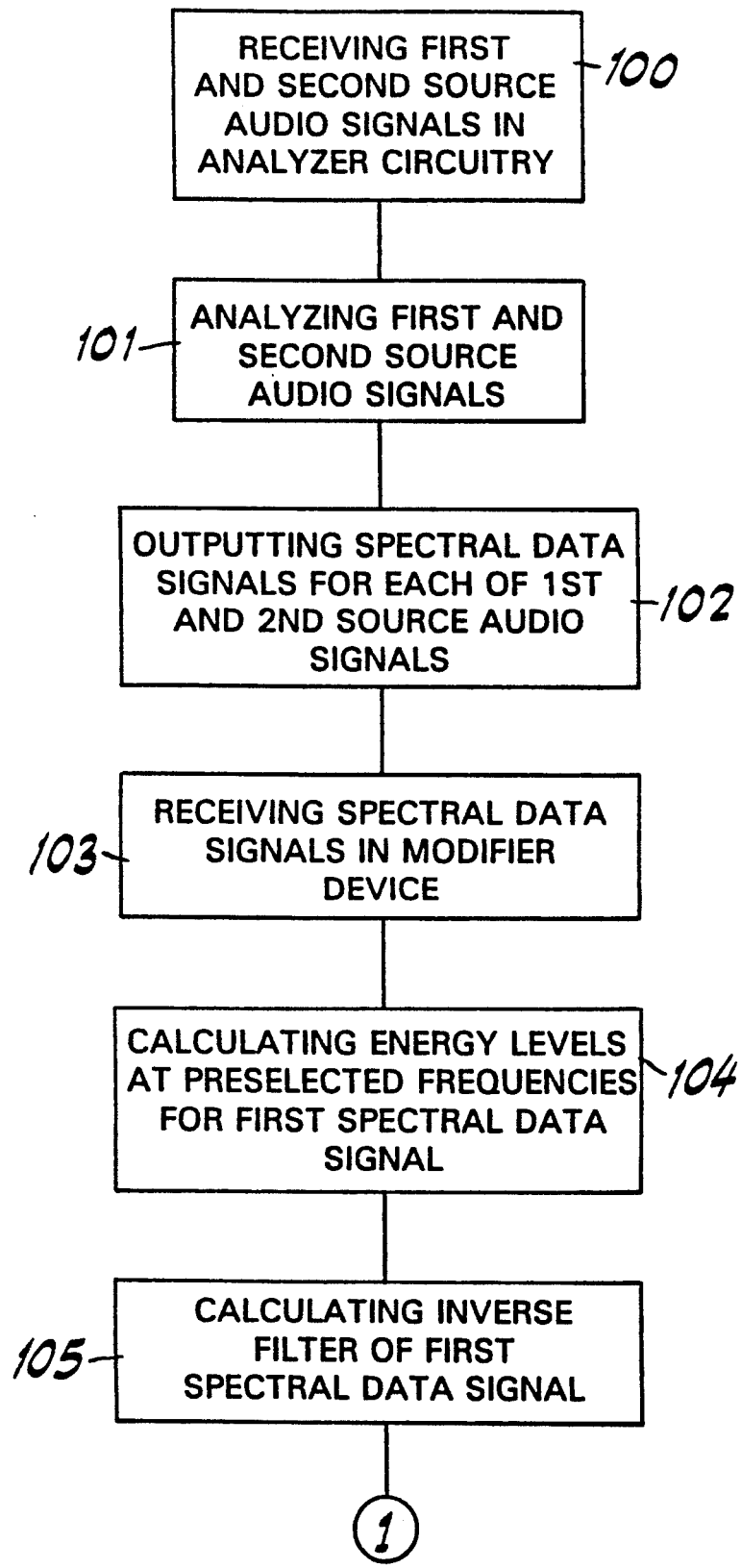
FIGS. 2A and 2B illustrate a block flow diagram of the method for mixing source audio signals.
Figure 2B:
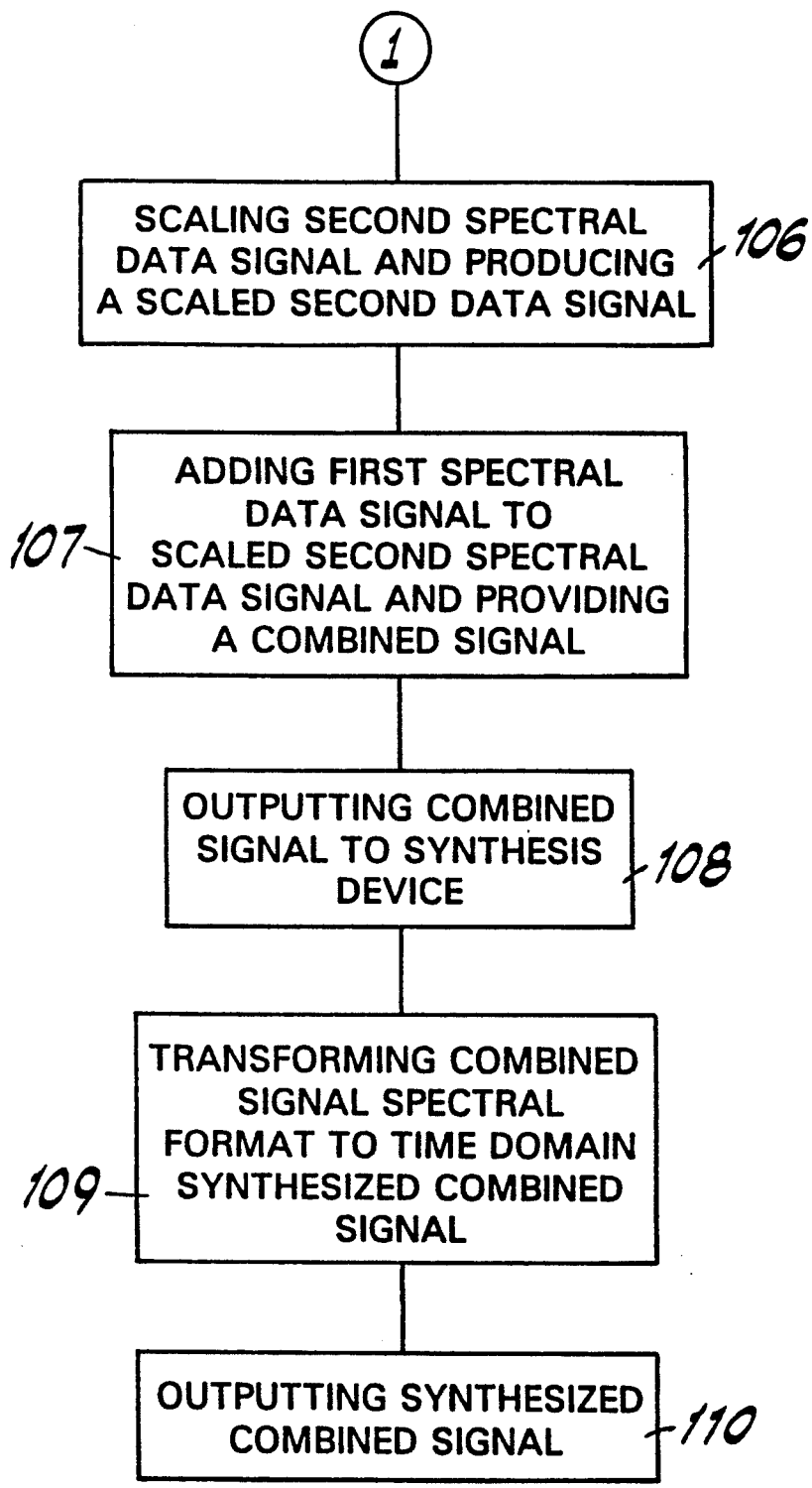

Referring now to FIGS. 2a and 2b, the mixing of two or more audio signals in the system of the present invention begins with the analyzer circuitry 26 receiving at least the first and second source audio signals 22, 24 respectively (step 100). The first source audio signal 22 may comprise, for example, a voice or narration signal and the second source audio signal 24 may comprise, for example, a music signal. Each of these source audio signals 22 and 24 are then analyzed (step 101) whereby the respective signals are transformed into spectral data signals comprising an aggregate of sinusoids of preselected frequencies having different phases and energy levels (amplitudes) arranged within predetermined spectral bands. The transformation is accomplished by performing a Fourier analysis on each of the respective source audio signals 22 and 24.

Once analyzed and transformed into spectral data signals corresponding to the first and second source audio signals 22 and 24, respectively, the respective spectral data signals are output (step 102) to, and received by (step 103) the modifier device 30. Once received in the modifier device 30, the system continues to operate on the respective spectral data signals by calculating (step 104) the energy levels for the first spectral data signal (corresponding to the first source audio signal 22) at the preselected frequencies. The system also calculates (step 105) the inverse filter of the first spectral data signal. The step of calculating the inverse filter (step 105), may comprise, for example, the additional steps of calculating, for each preselected frequency in each predetermined spectral of the first spectral data signal, an energy level, or signal amplitude which is inversely proportional to the corresponding signal energy level at the corresponding preselected frequency in the corresponding spectral band of the second spectral data signal.

The audio signals mixing technique further comprises the step of scaling (step 106) the second spectral data signal by the application of the inverse filter to the second spectral data signal. The step of scaling (step 106) the second spectral data signal may include, for example the step of multiplying the energy levels for each frequency and spectral band of the second spectral data signal, by a factor corresponding to the inverse of the relative strength (energy level) of the first spectral data signal for corresponding frequencies and spectral bands. The step of scaling (step 105) further comprises the step of producing a scaled second spectral data signal.

The audio signals mixing technique also includes the step of adding (step 107) the first spectral data signal to the scaled second spectral data signal to produce a combined signal which is output (step 108) to a synthesis device 40. The combined signal is then transformed (step 109) from its spectral format (frequency-based) to a time domain format comprising a synthesized combined signal 46 and then output (step 110) for further processing.

What is claimed is:

1. An audio signal mixing system comprising:
   a spectral content analyzer for determining a spectral content for each of a received first source audio signal and a second source audio signal to produce at least a respective first and second spectral data signal, each data signal comprising a plurality of spectral bands;
   a modifier device including means for modifying said second spectral data signal in spectral bands thereof in dependence on a first predetermined proportion of said first spectral data signal in corresponding spectral bands to obtain a modified second spectral data signal;
   means for adding said first spectral data signal with said modified second spectral data signal to produce a combined signal; and
   means for synthesizing said combined signal to produce a synthesized combined audio signal.

2. The audio signal mixing system of claim 1 wherein said spectral content analyzer comprises analyzer circuitry programmed to receive said first and second source audio signals and convert each of said first and second source audio signals into a spectral data signal comprising a plurality of energy levels at preselected frequencies within said spectral bands.

3. The audio signal mixing system of claim 2 wherein said analyzer circuitry comprises first and second analyzer circuit boards said first analyzer circuit board adapted to receive said first source audio signal and said second analyzer circuit board adapted to receive said second source audio signal.

4. The audio signal mixing system of claim 1 wherein said modifier device further comprises:
   first calculating means for determining energy levels of preselected frequencies within said spectral bands of said first spectral data signal, said first calculating means also producing a first calculated signal;
   second calculating means adapted to receive said first calculated signal and said second spectral data signal to calculate an inverse filter therefrom; and
   means for scaling adapted to receive said inverse filter and said second spectral data signal, and to produce a scaled second spectral data signal.

5. The audio signal mixing of claim 4 wherein said modified device further comprises means for adding said scaled second spectral data signal and said first spectral data signal to produce a combined signal.

6. The audio signal mixing system of claim 5 wherein said first calculating means comprises logic circuitry programmed to perform a Fourier analysis of said first source audio signal.

7. The audio signal mixing system of claim 5 wherein said second calculating means comprises logic circuitry programmed to modify said energy levels of said first calculated signal according to a second predetermined proportion of said energy levels of said second spectral data signal.

8. The audio signal mixing system of claim 7 wherein the second predetermined proportion equals 100 percent.

9. The audio signal mixing system of claim 5 wherein said means for scaling comprises logic circuitry programmed to apply said inverse filter to said second spectral data signal by modifying said second spectral data signal in each said spectral band and for each said preselected frequency by a factor corresponding to a ratio of said energy levels of said inverse filter to said energy levels of said second spectral data signal for corresponding said preselected frequency and said spectral band.

10. The audio signal mixing system of claim 1 wherein said means for synthesizing comprises logic circuitry programmed to apply an inverse Fourier analysis to said combined signal to produce said synthesized combined audio signal, said synthesized combined audio signal comprising a time-domain signal.

11. An audio signal mixing system comprising:
   a spectral content analyzer for determining a spectral content for each of a received first source audio signal and a second source audio signal to produce at least a respective first and second spectral data signal, each data signal comprising a plurality of spectral bands;
   a modifier device including means for modifying said second spectral data signal in spectral bands thereof in dependence on a first predetermined proportion of said first spectral data signal in corresponding spectral bands to obtain a modified second spectral data signal said modifier device further comprising:
   first calculating means for determining energy levels of preselected frequencies within said spectral bands of said first spectral data signal, said first calculating means also producing a first calculated signal,
   second calculating means adapted to receive said first calculated signal and said second spectral data signal to calculate an inverse filter therefrom,
   means for scaling adapted to receive said inverse filter and said second spectral data signal, and to produce a scaled second spectral data signal, said means for scaling adapted to modify said second spectral data signal, for each said preselected frequency, over a predetermined range of contiguous frequencies in each said spectral band, in dependence on a first predetermined proportion of said energy level of said first spectral data signal at said preselected frequency in a corresponding spectral band;
   means for adding said first spectral data signal with said modified second spectral data signal to produce a combined signal; and
   means for synthesizing said combined signal to produce a synthesized combined audio signal.

12. A method for mixing source audio signals comprising the steps of:
   analyzing at least a first source audio signal and a second source audio signal and producing therefrom first and second spectral data signals, respectively; calculating energy levels at preselected frequencies for said first spectral data signal;
   calculating an inverse filter of said first spectral data signal;
   scaling said second spectral data signal and producing a scaled second data signal;
   adding said first spectral data signal to said scaled second data signal, and producing a combined signal; and
   synthesizing said combined signal comprising a spectral format to produce a synthesized combined signal comprising a time domain format.

13. The method of claim 12 wherein the step of analyzing said first and second source audio signals further comprises the step of converting said first and second source audio signals into first and second spectral data signals, respectively, each of said first and second spectral data signals comprising a plurality of energy levels at preselected frequencies within spectral bands.

14. The method of claim 12 wherein the step of calculating energy levels at preselected frequencies further comprises the step of performing a Fourier analysis on said first source audio signal and producing a first calculated signal comprising digital data corresponding to the energy levels of the first spectral data signal.

15. The method of claim 14 wherein the step of calculating an inverse filter further comprises the steps of:
   determining the energy levels of each of the first calculated signal and the second spectral data signal for preselected frequencies within a plurality of spectral bands; and
   modifying the first calculated signal by making the energy levels of the first calculated signal, for particular preselected frequencies within the plurality of spectral bands, inversely proportional to the energy levels of the second spectral data signal for corresponding preselected frequencies and spectral bands.

16. The method of claim 12 wherein the step of scaling said second spectral data signal comprises the step of applying the inverse filter of said first spectral data signal to said second spectral data signal.

17. The method of claim 16 wherein the step of applying the inverse filter to said second spectral data signal further comprises the step of multiplying the energy levels of said second spectral data signal for each of the preselected frequencies within each spectral band by a factor corresponding to a ratio of respective energy levels within the spectral bands of the inverse filter and the second spectral data signal.

18. The method of claim 17 wherein the step of applying the inverse filter further comprises the step of:
   determining a range of contiguous frequencies for each said preselected frequency, which includes said preselected frequency; and
   modifying the energy levels of said second spectral data signal over the entire range of contiguous frequencies in accordance with a predetermined proportion of the energy level of said first spectral data signal at said preselected frequency in a corresponding spectral band.

* * * * *